(12) United States Patent
Nagai

(10) Patent No.: US 7,635,885 B2
(45) Date of Patent: Dec. 22, 2009

(54) SEMICONDUCTOR DEVICE AND MANUFACTURING METHOD OF THE SAME

(75) Inventor: Kouichi Nagai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 213 days.

(21) Appl. No.: 11/601,807

(22) Filed: Nov. 20, 2006

(65) Prior Publication Data

US 2007/0097726 A1     May 3, 2007

Related U.S. Application Data

(63) Continuation of application No. PCT/JP2004/007817, filed on Jun. 4, 2004.

(51) Int. Cl.
    *H01L 31/113* (2006.01)
(52) U.S. Cl. .............................. 257/295; 257/E27.104; 257/E29.164
(58) Field of Classification Search ............... 257/295, 257/E27.104, E29.164, E21.208, E21.663, 257/E21.664
    See application file for complete search history.

(56) References Cited

U.S. PATENT DOCUMENTS

| 5,990,508 | A | 11/1999 | Shinohara |
| 6,043,526 | A * | 3/2000 | Ochiai ......................... 257/295 |
| 6,417,575 | B2 | 7/2002 | Harada et al. |
| 6,611,014 | B1 | 8/2003 | Kanaya et al. |
| 6,927,410 | B2 * | 8/2005 | Chen .............................. 257/2 |
| 6,982,453 | B2 | 1/2006 | Kanaya et al. |
| 7,402,871 | B2 * | 7/2008 | Song ........................... 257/379 |
| 2002/0005583 | A1 | 1/2002 | Harada et al. |
| 2004/0084701 | A1 | 5/2004 | Kanaya et al. |
| 2006/0043446 | A1 * | 3/2006 | Fukada ......................... 257/295 |

FOREIGN PATENT DOCUMENTS

CN          1202011 A          12/1998

OTHER PUBLICATIONS

Chinese Office Action issued May 14, 2008, issued in corresponding Chinese Patent Application No. 2004800428080.
Notification of Transmittal of Translation of the International Preliminary Report on Patentability (Form PCT/IB/338) of International Application No. PCT/JP2004/007817 mailed Dec. 14, 2006 with English translation Forms PCT/ISA/237.
Patent Abstract of Japan, Publication No. 10-144878, dated May 29, 1998.
Patent Abstract of Japan, Publication No. 2001-351920 dated Dec. 21, 2001.
Patent Abstract of Japan, Publication No. 2001-358309 dated Dec. 26, 2001.
International Search Report of PCT/JP2004/007817, date of mailing Sep. 7, 2004.

* cited by examiner

*Primary Examiner*—Zandra Smith
*Assistant Examiner*—Paul E Patton
(74) *Attorney, Agent, or Firm*—Westerman, Hattori, Daniels & Adrian, LLP

(57) ABSTRACT

An interlayer insulating film (14) covering a ferroelectric capacitor is formed and a contact hole (19) reaching a top electrode (11a) is formed in the interlayer insulating film (14). An Al wiring (17) connected to the top electrode (11a) via the contact hole (19) is formed on the interlayer insulating film (14). A planar shape of the contact hole (19) is an ellipse.

5 Claims, 13 Drawing Sheets

SEMICONDUCTOR DEVICE AND MANUFACTURING METHOD OF THE SAME

TECHNICAL FIELD

The present invention relates to a semiconductor device suitable for a nonvolatile memory with ferroelectric capacitors and a method of manufacturing the same.

BACKGROUND ART

A ferroelectric capacitor provided to a ferroelectric memory or the like is constituted by sandwiching a ferroelectric film between a bottom electrode and a top electrode.

However, adhesiveness between the ferroelectric film and the top electrode is low, the top electrode may peel off from the ferroelectric film, and a gap may occur between them as shown in FIG. 6. When such gap occurs, the ferroelectric capacitor does not operate normally.

Patent Document 1: Japanese Patent Application Laid-open No. 2001-351920

SUMMARY OF THE INVENTION

An object of the present invention is to provide a semiconductor device capable of suppressing peeling off of a top electrode from a ferroelectric film and a method of manufacturing the same.

The present inventor comes to an idea of various aspects of the invention as shown in the following as a result of a hard study to solve the above-stated problems.

A semiconductor device according to the present invention includes a semiconductor substrate, a ferroelectric capacitor formed above the semiconductor substrate, an interlayer insulating film covering the ferroelectric capacitor, in which a hole reaching a top electrode of the ferroelectric capacitor is formed, and a wiring formed on the interlayer insulating film and connected to the top electrode via the hole. In the semiconductor device according to the present invention, a planar shape of the hole is a shape in which lengths of two axes orthogonal to each other are different.

In a manufacturing method of a semiconductor device, a ferroelectric capacitor is formed above a semiconductor substrate, and then an interlayer insulating film covering the ferroelectric capacitor is formed. Next, a hole reaching a top electrode of the ferroelectric capacitor is formed in the interlayer insulating film. After that, a wiring connected to the top electrode via the hole is formed on the interlayer insulating film. A planar shape of the hole is set to a shape in which lengths of two axes orthogonal to each other are different, in the step of forming the hole.

DETAILED DESCRIPTION OF THE PREFERRED EMBODIMENTS

Figure 1:
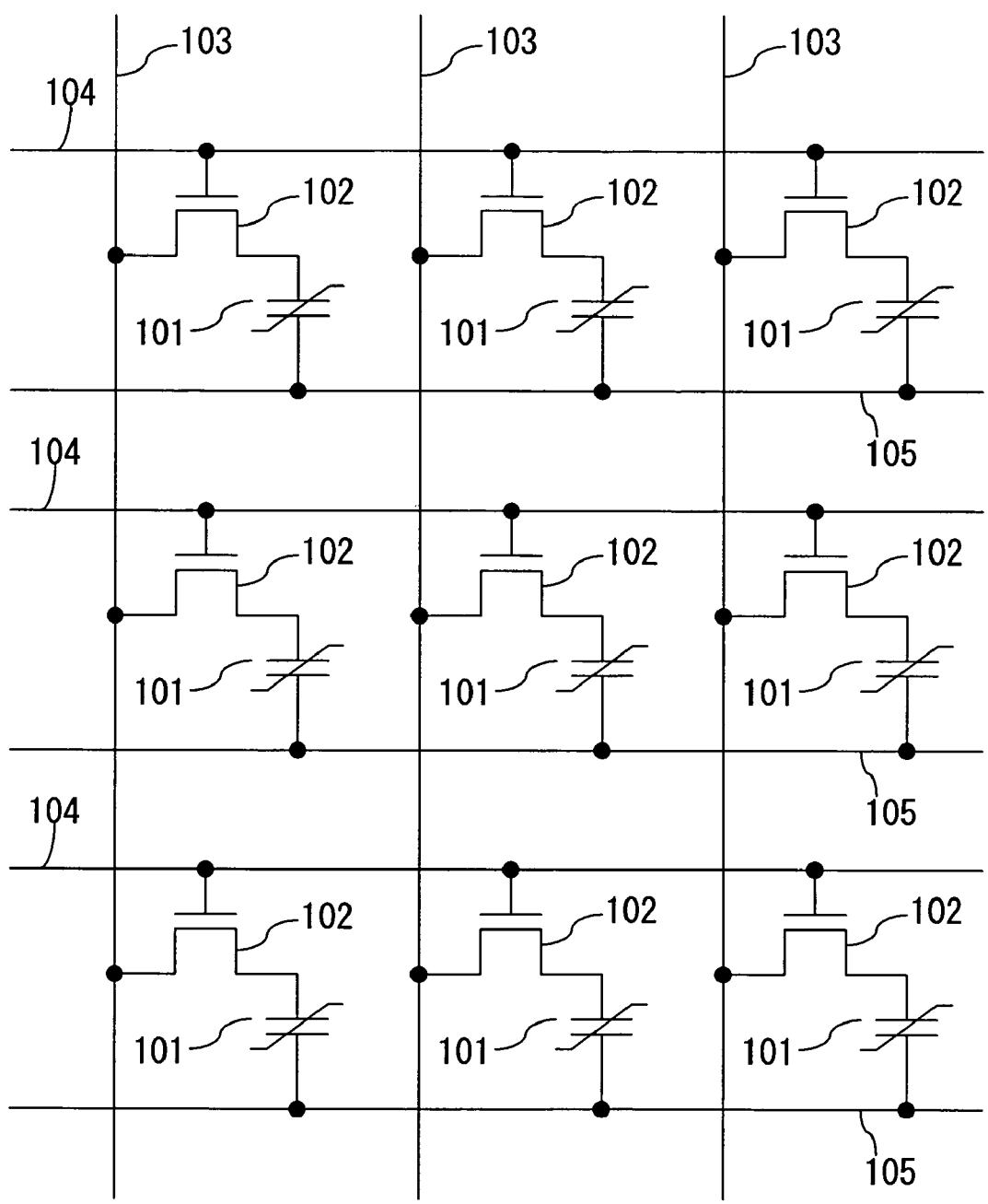
FIG. 1 is a circuit diagram showing a configuration of a memory cell array of a ferroelectric memory (semiconductor device) to be manufactured by a method according to an embodiment of the present invention.

Hereinafter, embodiments of the present invention are described concretely with reference to the attached drawings. FIG. 1 is a circuit diagram showing a configuration of a memory cell array of a ferroelectric memory (semiconductor device) to be manufactured by a method according to an embodiment of the present invention.

In this memory cell array, plural number of bit lines 103 extending in one direction, and plural number of word lines 104 and plate lines 105 extending in perpendicular direction to the direction the bit lines 103 are extending, are provided. Besides, plural number of memory cells of a ferroelectric memory according to the present embodiment are arranged in an array form in a manner to coincide with a lattice formed by these bit lines 103, the word lines 104, and the plate lines 105. In each of the memory cells, a ferroelectric capacitor 101 and a MOS transistor 102 are provided.

A gate of the MOS transistor 102 is connected to the word line 104. Besides, one source/drain of the MOS transistor 102 is connected to the bit line 103, and the other source/drain is connected to one electrode of the ferroelectric capacitor 101. The other electrode of the ferroelectric capacitor 101 is connected to the plate line 105. Incidentally, the respective word lines 104 and plate lines 105 are commonly used among the plural number of MOS transistors 102 arranged in the same direction as the direction in which the word lines 104 and the plate lines 105 are extending. Similarly, the respective bit lines 103 are commonly used among the plural number of MOS transistors 102 arranged in the same direction as the direction in which the bit lines 103 are extending. The direction in which the word lines 104 and the plate lines 105 are extending and the direction in which the bit lines 103 are extending may be referred to as a row direction and a column direction respectively. However, a disposition of the bit lines 103, the word lines 104, and the plate lines 105 is not limited to the above-stated one.

Data are stored depending on a polarization state of a ferroelectric film provided to the ferroelectric capacitor 101 in the memory cell array of the ferroelectric memory thus configured.

Figure 2A:
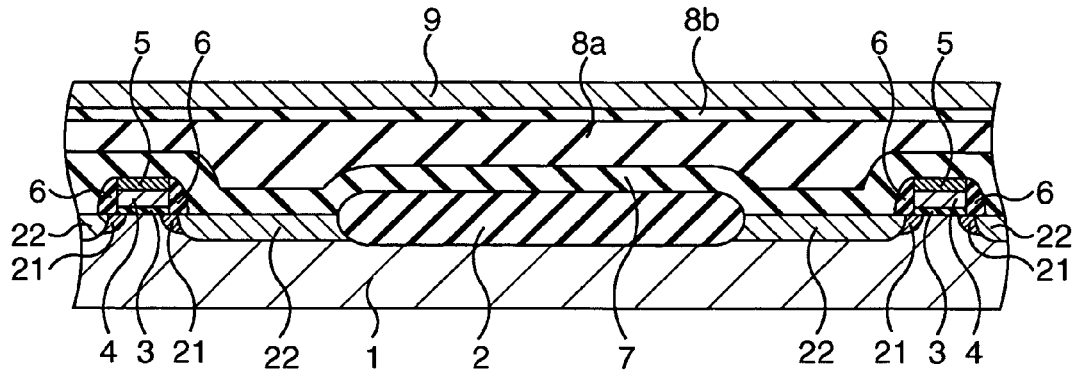
FIG. 2A is a sectional view showing a method of manufacturing a ferroelectric memory according to the embodiment of the present invention in the order of steps.
Figure 7:
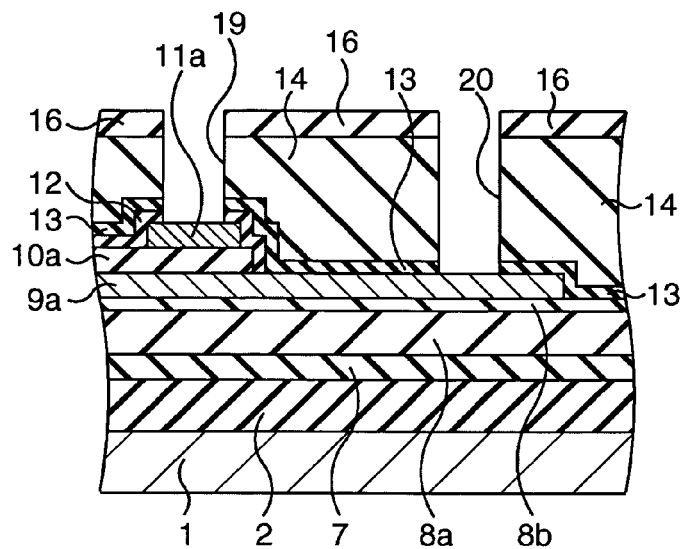
FIG. 7 is a sectional view showing a contact hole 20.

Next, the embodiments of the present invention are described. It should be noted that a cross-sectional structure of each memory cell of the ferroelectric memory will be described herein together with a manufacturing method thereof for convenience. FIG. 2A to FIG. 2N are sectional views showing a method of manufacturing the ferroelectric memory (semiconductor device) according to the embodiment of the present invention in the order of steps. Besides, FIG. 3A is a plan view showing the same process as FIG. 2D. Incidentally, in the following description, a ratio of an area of a certain portion on a basis of an area of a wafer (semiconductor substrate) is called as an area ratio of the corresponding portion in a plan view. Besides, FIG. 7 is a view showing a cross section perpendicular to a cross section shown in FIG. 2L.

In the present embodiment, first, an element isolation insulating film 2 sectionalizing an element active region is formed on a surface of a semiconductor substrate 1 of an Si substrate or the like by, for example, a LOCOS (Local Oxidation of Silicon) method as shown in FIG. 2A. Next, a transistor (MOSFET) including a gate insulating film 3, a gate electrode 4, a silicide layer 5, a sidewall 6, and a source/drain diffusion layer composed of a low concentration diffusion layer 21 and a high concentration diffusion layer 22 is formed inside of each element active region sectionalized by the element isolation insulating film 2. Next, a silicon oxynitride film 7 is formed on a whole surface so as to cover the MOSFETs, and further a silicon oxide film 8a is formed on the whole surface. The silicon oxynitride film 7 is formed to prevent a hydrogen-induced degradation of the gate insulating film 3 and the like when the silicon oxide film 8a is formed.

After that, a silicon oxide film 8b is further formed on the silicon oxide film 8a by using a TEOS. A thickness of the silicon oxide film 8b is to be, for example, approximately 100 nm. Subsequently, a bottom electrode film 9 is formed on the silicon oxide film 8b. The bottom electrode film 9 is composed of, for example, a Ti film and a Pt film formed thereon. Thicknesses of the Ti film and the Pt film are to be, for example, 20 nm and 180 nm, respectively.

Figure 2B:
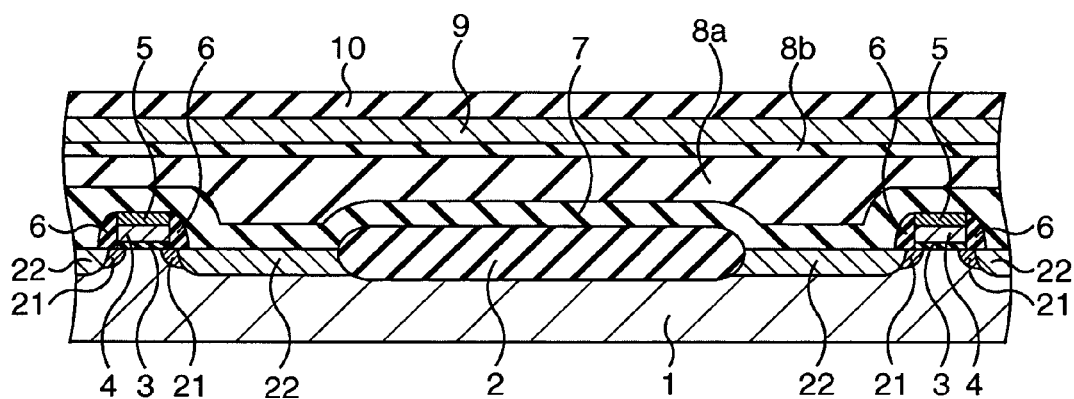
FIG. 2B is a sectional view showing the method of manufacturing a ferroelectric memory according to the embodiment of the present invention in the order of steps subsequent to FIG. 2A.

Next, a ferroelectric film 10 is formed on the bottom electrode film 9 in an amorphous state as shown in FIG. 2B. As the ferroelectric film 10, for example, a PZT ($Pb(Zr,Ti)O_3$) film is formed. A thickness of the ferroelectric film 10 is to be, for example, approximately 200 nm. Next, a heat treatment is performed in an atmosphere containing Ar and $O_2$ at approximately 600° C. to 700° C. As a result, the ferroelectric film 10 is crystallized.

Figure 2C:
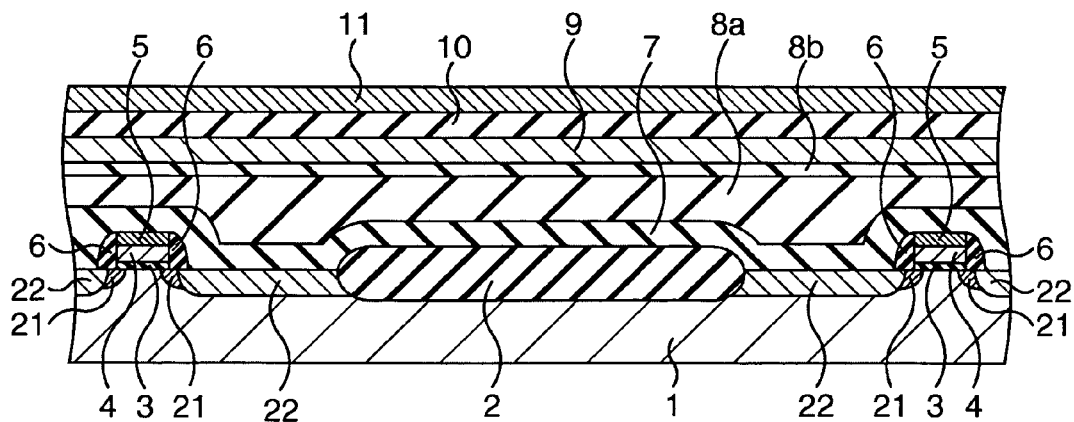
FIG. 2C is a sectional view showing the method of manufacturing a ferroelectric memory according to the embodiment of the present invention in the order of steps subsequent to FIG. 2B.

After that, a top electrode film 11 is formed on the ferroelectric film 10 as shown in FIG. 2C. As the top electrode film 11, for example, an $IrO_x$ film (iridium oxide film) such as an $IrO_{1.4}$ film and $IrO_2$ film is formed.

Figure 2D:
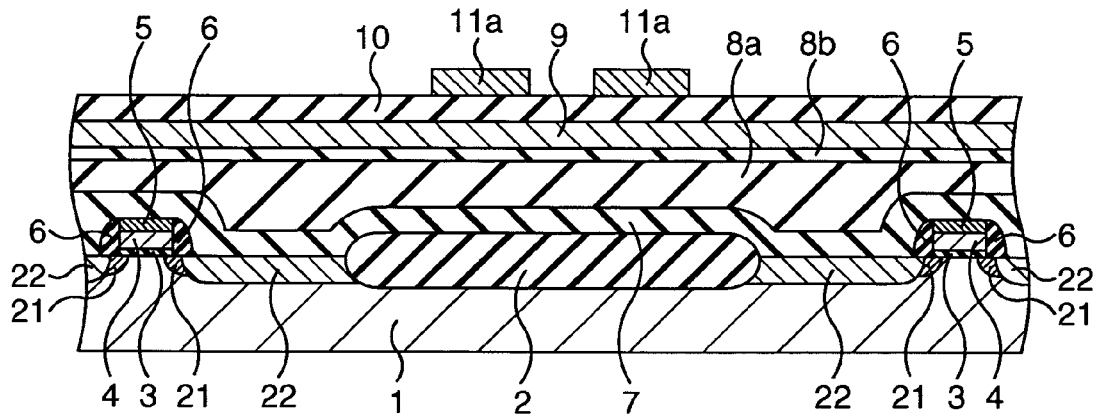
FIG. 2D is a sectional view showing the method of manufacturing a ferroelectric memory according to the embodiment of the present invention in the order of steps subsequent to FIG. 2C.
Figure 3A:
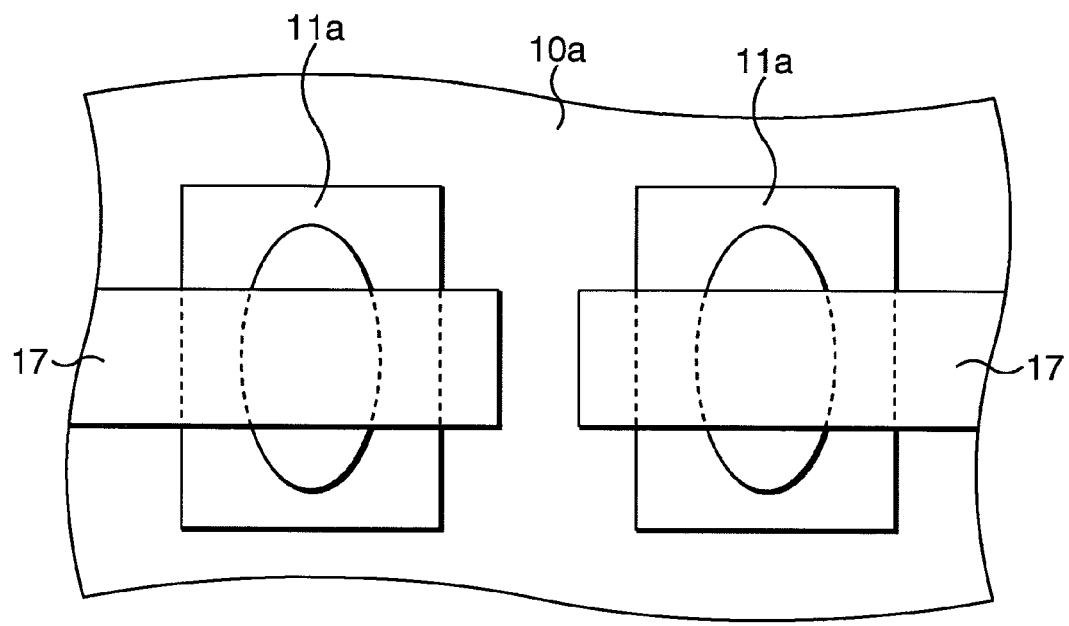
FIG. 3A is a schematic view showing a planar shape of a wiring 17 in the embodiment of the present invention.

Subsequently, a top electrode 11a is formed by patterning the top electrode film 11 as shown in FIG. 2D. Next, a heat treatment in an atmosphere containing oxygen is performed to recover a damage and the like caused by the patterning.

Figure 2E:
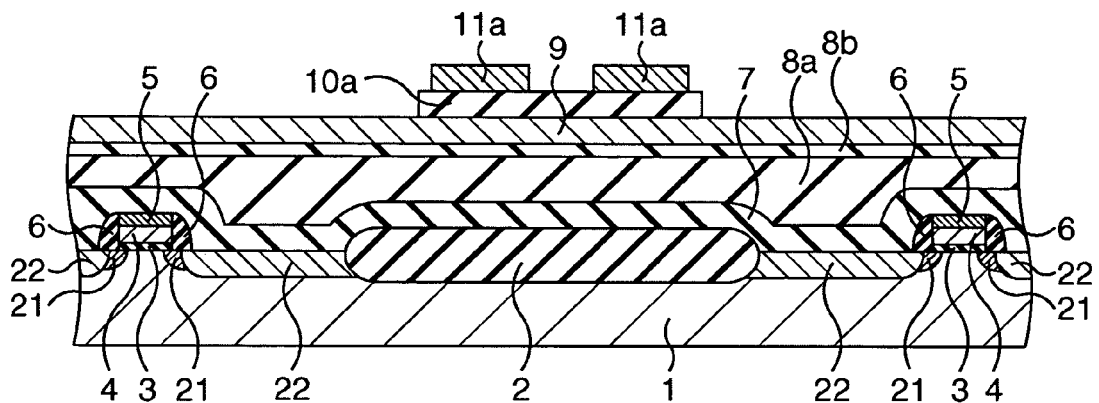
FIG. 2E is a sectional view showing the method of manufacturing a ferroelectric memory according to the embodiment of the present invention in the order of steps subsequent to FIG. 2D.

After that, a capacitor insulating film 10a is formed by performing a patterning of the ferroelectric film 10 as shown in FIG. 2E. Subsequently, oxygen annealing for peeling prevention of an $Al_2O_3$ film which will be formed later is performed.

Figure 2F:
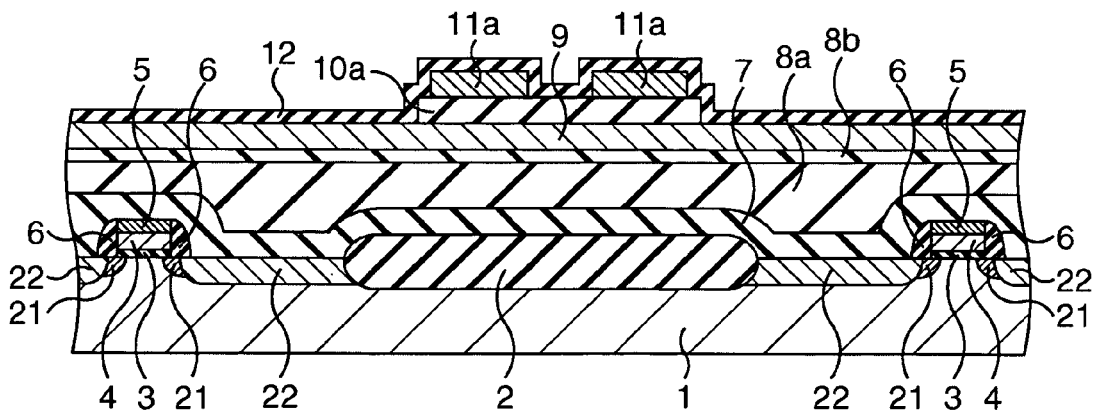
FIG. 2F is a sectional view showing the method of manufacturing a ferroelectric memory according to the embodiment of the present invention in the order of steps subsequent to FIG. 2E.

Next, an $Al_2O_3$ film 12 as a protective film is formed on the whole surface by a sputtering method as shown in FIG. 2F. Subsequently, oxygen annealing is performed to reduce damage by the sputtering. A penetration of hydrogen from external into the ferroelectric capacitor is prevented by the protective film ($Al_2O_3$ film 12).

Figure 2G:
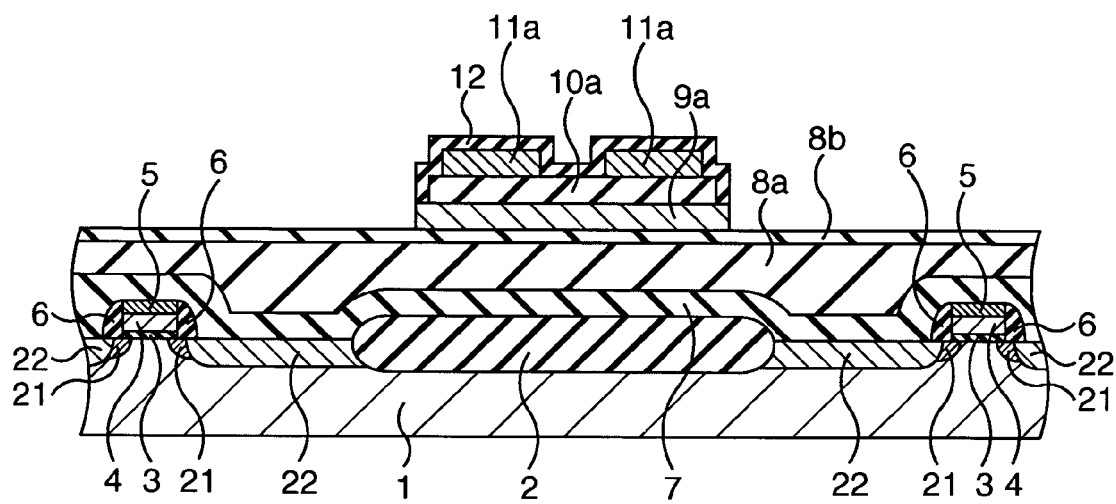
FIG. 2G is a sectional view showing the method of manufacturing a ferroelectric memory according to the embodiment of the present invention in the order of steps subsequent to FIG. 2F.

After that, patterning of the $Al_2O_3$ film 12 and the bottom electrode film 9 is performed, to thereby form a bottom electrode 9a as shown in FIG. 2G. Subsequently, oxygen annealing for peeling prevention of an $Al_2O_3$ film which will be formed later is performed.

Figure 2H:
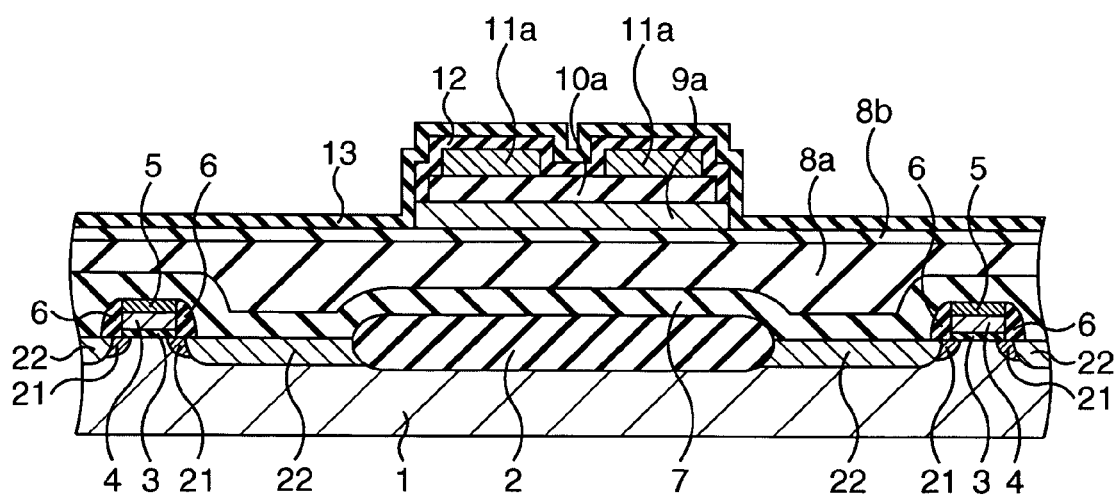
FIG. 2H is a sectional view showing the method of manufacturing a ferroelectric memory according to the embodiment of the present invention in the order of steps subsequent to FIG. 2G.

Next, an $Al_2O_3$ film 13 is formed on the whole surface as a protective film by a sputtering method as shown in FIG. 2H. Subsequently, oxygen annealing is performed to reduce a capacitor leak.

Figure 2I:
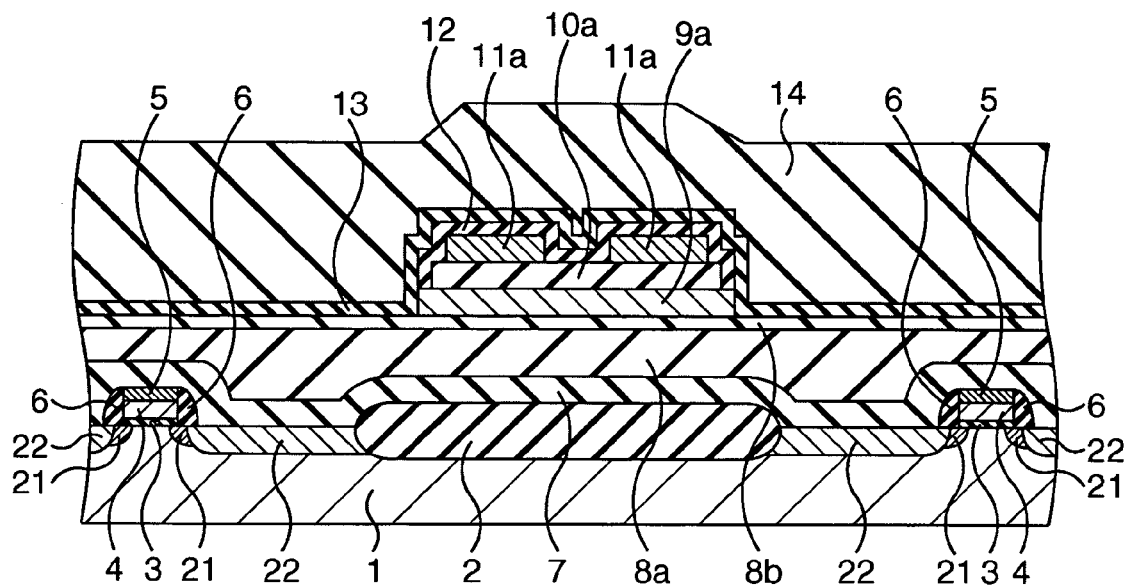
FIG. 2I is a sectional view showing the method of manufacturing a ferroelectric memory according to the embodiment of the present invention in the order of steps subsequent to FIG. 2H.

After that, an interlayer insulating film 14 is formed on the whole surface by a high density plasma process as shown in FIG. 2I. A thickness of the interlayer insulating film 14 is, for example, approximately 1.5 μm.

Figure 2J:
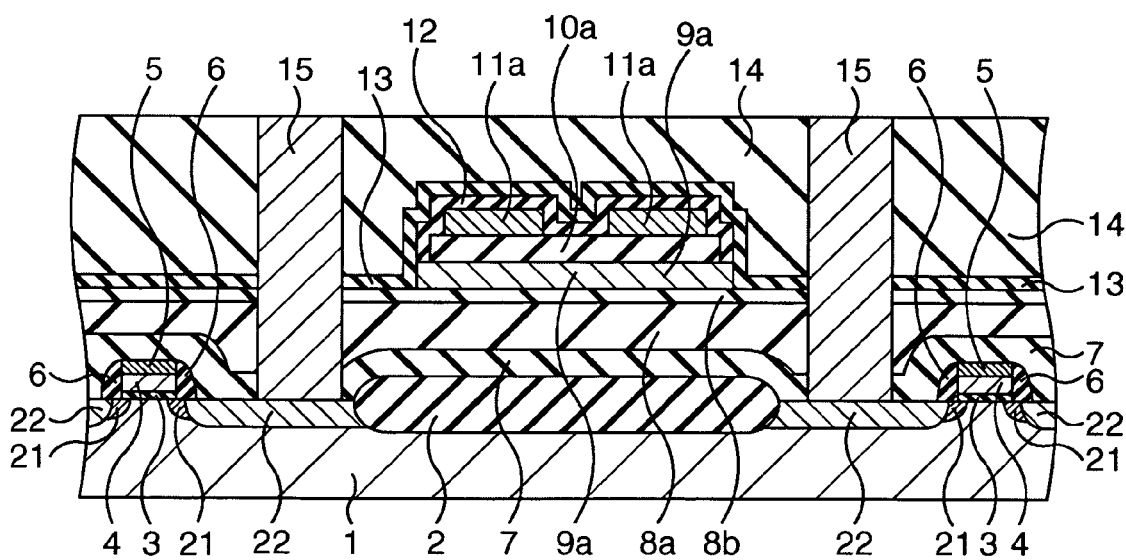
FIG. 2J is a sectional view showing the method of manufacturing a ferroelectric memory according to the embodiment of the present invention in the order of steps subsequent to FIG. 2I.

Subsequently, planarization of the interlayer insulating film 14 is performed by a CMP (Chemical Mechanical Polishing) method as shown in FIG. 2J. Next, a plasma process using an $N_2O$ gas is performed. As a result, a surface layer portion of the interlayer insulating film 14 is a little nitrided, and moisture can hardly penetrate into inside thereof. Incidentally, this plasma process becomes effective if a gas in which at least either N or O is contained is used. Subsequently, holes reaching the high concentration diffusion layer 22 of the transistor are formed in the interlayer insulating film 14, the Al$_2$O$_3$ film 13, the silicon oxide film 8b, the silicon oxide film 8a, and the silicon oxynitride film 7. After that, a Ti film and a TiN film are continuously formed inside of the holes by a sputtering method, to thereby form a barrier metal film (not shown). Subsequently, a W film is further embedded by a CVD (Chemical Vapor Deposition) method inside of the holes, and planarization of the W film is performed by a CMP method, to thereby form W plugs 15.

Figure 2K:
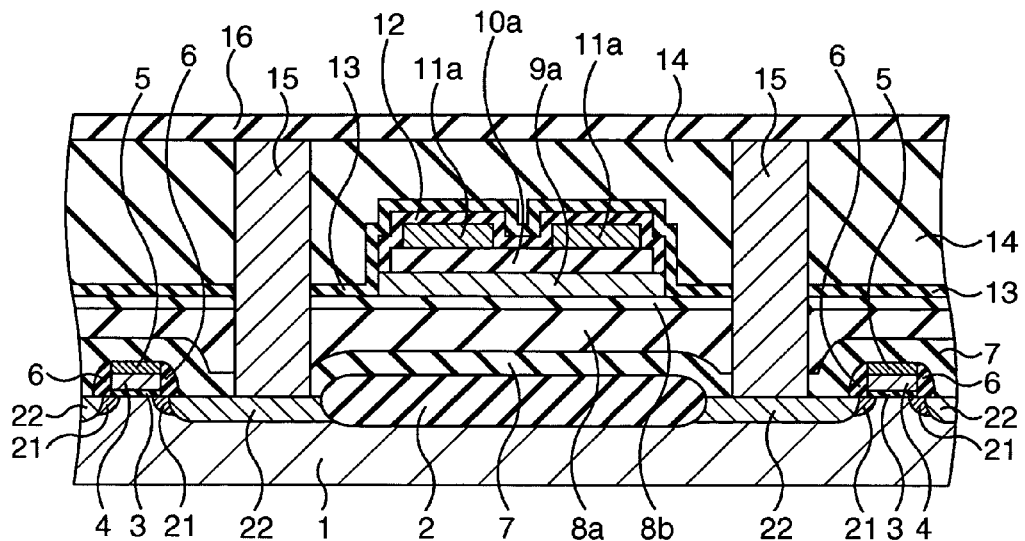
FIG. 2K is a sectional view showing the method of manufacturing a ferroelectric memory according to the embodiment of the present invention in the order of steps subsequent to FIG. 2J.

Next, an SiON film 16 as an oxidation preventing film for the W plugs 15 is formed by a plasma enhanced CVD method as shown in FIG. 2K.

Figure 2L:
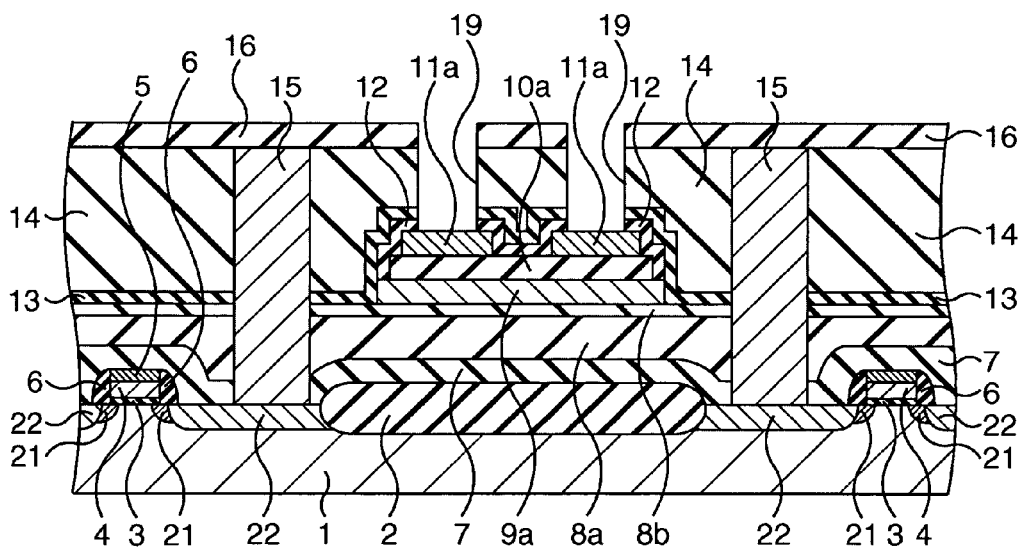
FIG. 2L is a sectional view showing the method of manufacturing a ferroelectric memory according to the embodiment of the present invention in the order of steps subsequent to FIG. 2K.

Subsequently, a contact hole 19 reaching the top electrode 11a and a contact hole 20 reaching the bottom electrode 9a are formed in the SiON film 16, the interlayer insulating film 14, the Al$_2$O$_3$ film 13, and the Al$_2$O$_3$ film 12 as shown in FIG. 2L and FIG. 7. After that, oxygen annealing is performed to recover the damage.

Figure 4A:
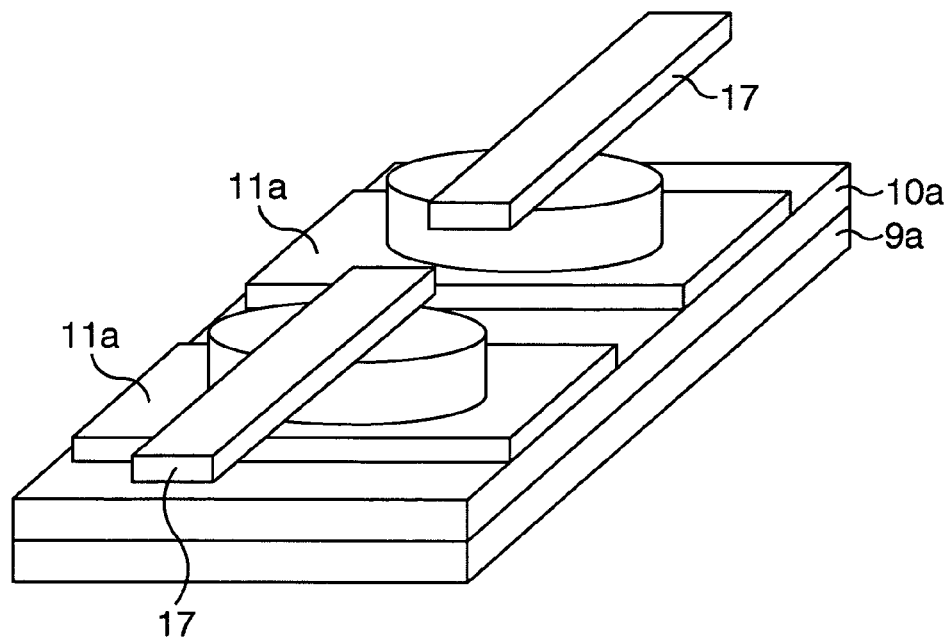
FIG. 4A is a schematic view showing a shape of the wiring 17 in the embodiment of the present invention.

Incidentally, in the present embodiment, a planar shape of the contact hole 19 is an ellipse as shown in FIG. 3A and FIG. 4A. At this time, a direction in which a major axis of the ellipse is extending corresponds to a direction in which a long side of the top electrode 11a is extending. Besides, lengths of the major axis and a minor axis are preferable to be as long as possible within a range capable of securing a predetermined amount of intervals between an outer edge of the top electrode 11a respectively. Namely, both lengths of the major axis and the minor axis are preferable to be as long as possible within a range of a displacement margin which is set for the top electrode 11a, and in particular, it is more preferable that both lengths correspond to the ranges of the respective displacement margins.

Figure 2M:
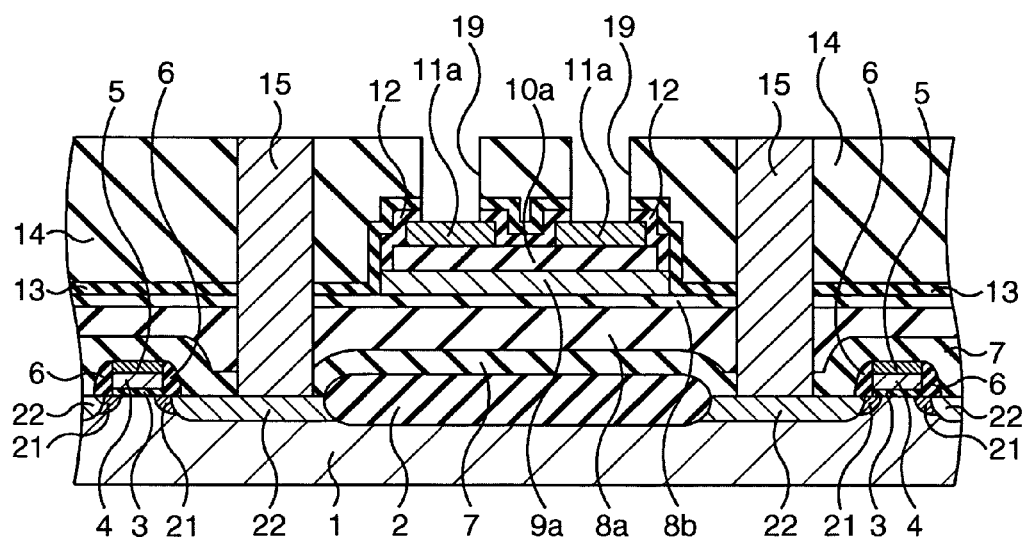
FIG. 2M is a sectional view showing the method of manufacturing a ferroelectric memory according to the embodiment of the present invention in the order of steps subsequent to FIG. 2L.
Figure 2N:
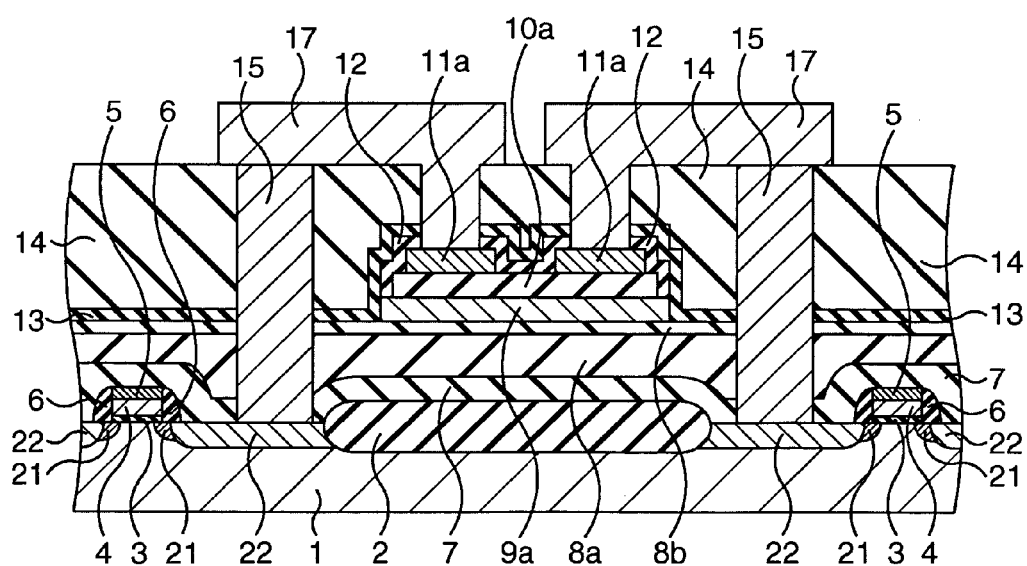
FIG. 2N is a sectional view showing the method of manufacturing a ferroelectric memory according to the embodiment of the present invention in the order of steps subsequent to FIG. 2M.

Subsequently, the SiON film 16 is removed for the whole surface by etch back as shown in FIG. 2M, to thereby expose surface of the W plug 15. Next, an Al film is formed under a state in which a part of a surface of the top electrode 11a, a part of a surface of the bottom electrode 9a, and the surface of the W plug 15 are exposed, and then, patterning of the Al film is performed, to thereby form Al wiring 17 as shown in FIG. 2N. At this time, for example, the W plug 15 and the top electrode 11a are connected with each other with a part of the Al wiring 17.

After that, forming an interlayer insulating film, forming a contact plug, forming wirings of a second layer from the bottom or later and the like are further performed. Then, a cover film composed of, for example, a TEOS oxide film and an SiN film is formed, so that a ferroelectric memory having a ferroelectric capacitor is completed.

In the present embodiment as stated above, the planar shape of the contact hole 19 reaching the top electrode 11a is to be the ellipse in which the direction the major axis is extending corresponds to that of the top electrode 11a. Consequently, it is possible to elongate the length of the major axis while elongating the length of the minor axis as long as possible within the range in which the interval between the outer edge of the top electrode 11a can be secured for the predetermined amount. Namely, an area of the contact hole 19 can be determined with considering not only the length of the short side but also the length of the long side of the top electrode 11a. Consequently, it becomes possible to enlarge an area of the contact hole 19 than the conventional one. It is therefore possible to enlarge a contact area between the Al wiring 17 and the top electrode 11a, and also, it is possible to eliminate stress operating on a contact surface between the Al wiring 17 and the top electrode 11a (external force per unit area) and stress operating on a contact surface between the top electrode 11a and the ferroelectric film 10a. As a result, it becomes possible to suppress peeling of the top electrode 11a from the ferroelectric film 10a.

Figure 3B:
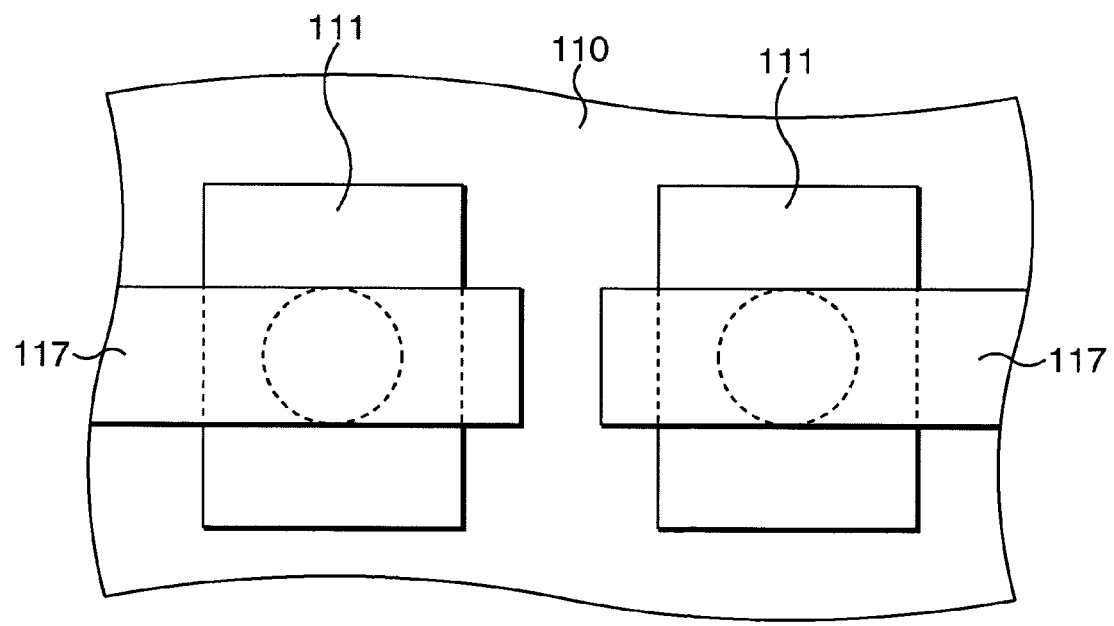
FIG. 3B is a schematic view showing a planar shape of a wiring 117 in a conventional ferroelectric memory.
Figure 4B:
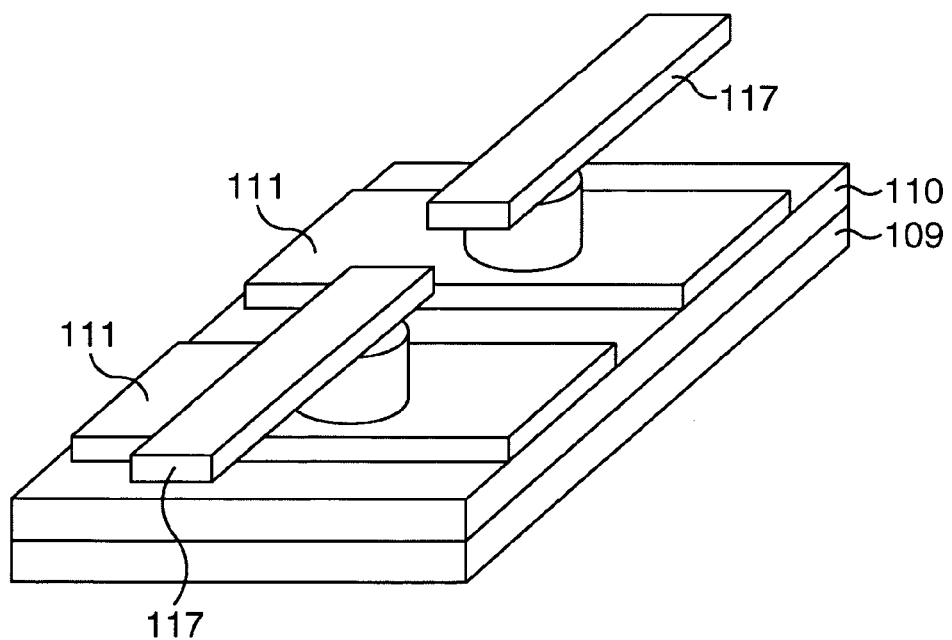
FIG. 4B is a schematic view showing a planar shape of the wiring 117 in a conventional ferroelectric memory.

On the contrary, in the conventional method of manufacturing the ferroelectric memory, a planar shape of a contact hole is a circle as same as the method of manufacturing other semiconductor devices such as a DRAM, as shown in FIG. 3B and FIG. 4B. A maximum value of a contact area between an Al wiring 117 and a top electrode 111 is therefore determined based on only a length of a long side of the top electrode 111. Consequently, stress operating on a contact surface between the Al wiring 117 and the top electrode 111, and stress operating on a contact surface between the top electrode 111 and a ferroelectric film 110 tend to be large; and therefore, peeling of the top electrode 111 tends to occur easily.

Figure 5A:
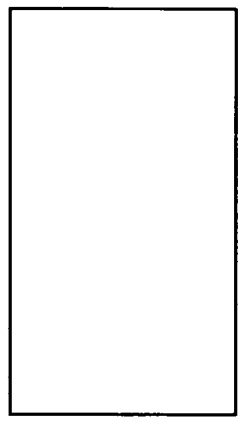
FIG. 5A is a view showing an example of a planar shape of a contact hole.
Figure 5B:
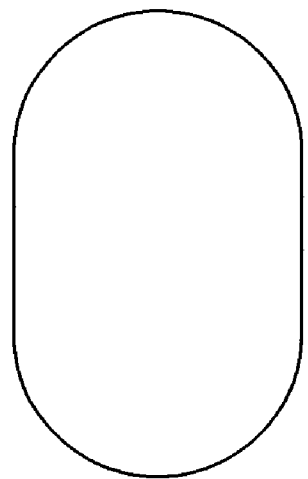
FIG. 5B is a view showing another example of a planar shape of a contact hole.
Figure 6:
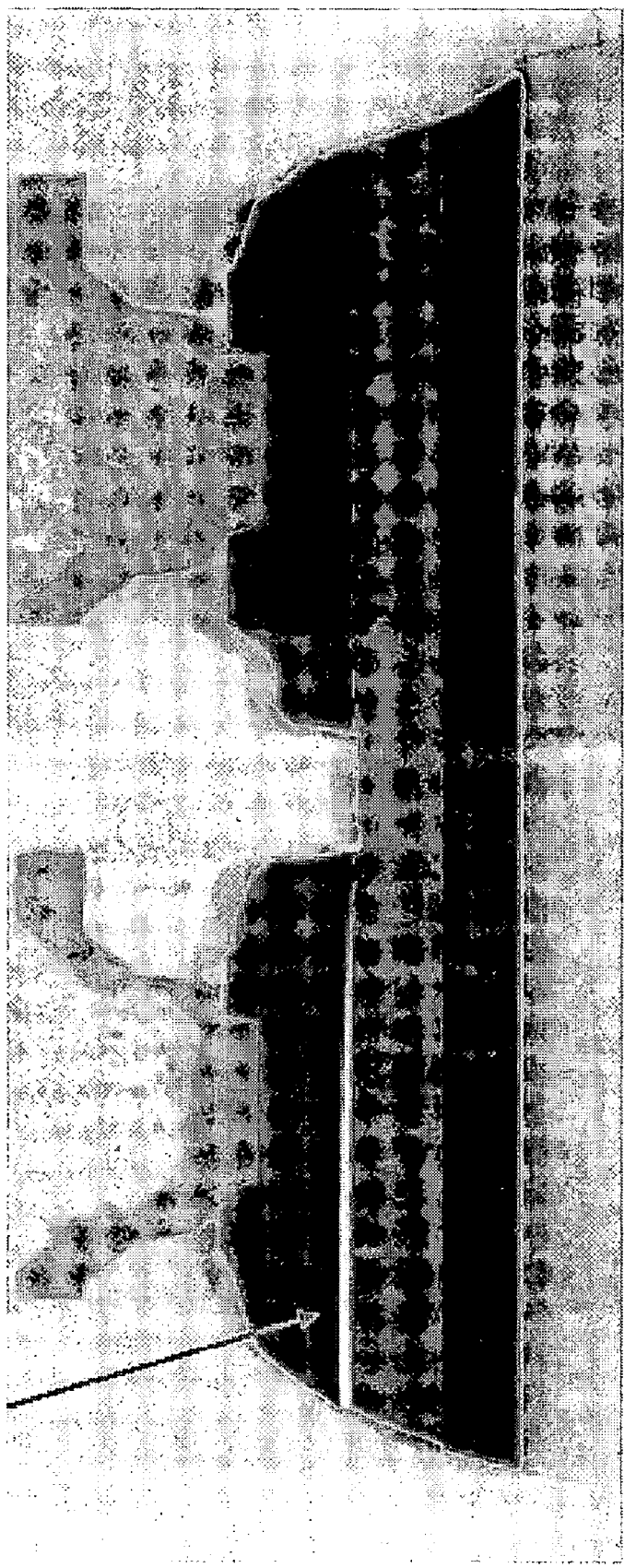
FIG. 6 is an SEM photo showing an appearance of peeling of a top electrode.

Incidentally, the planar shape of the contact hole reaching the top electrode is not limited to the ellipse, but it may be, for example, a rectangle (shown in FIG. 5A), a shape (shown in FIG. 5B) such as a track for athletic events (a shape rounded off four corners of a rectangle) or the like, as long as the lengths of two axes orthogonal to each other are different.

Besides, the present invention is applicable for both a ferroelectric capacitor having a stack-type structure and a ferroelectric capacitor having a planar-type structure.

Further, materials for the bottom electrode, the ferroelectric film and the top electrode are not limited to the ones in the above-stated embodiment.

Figure 8:
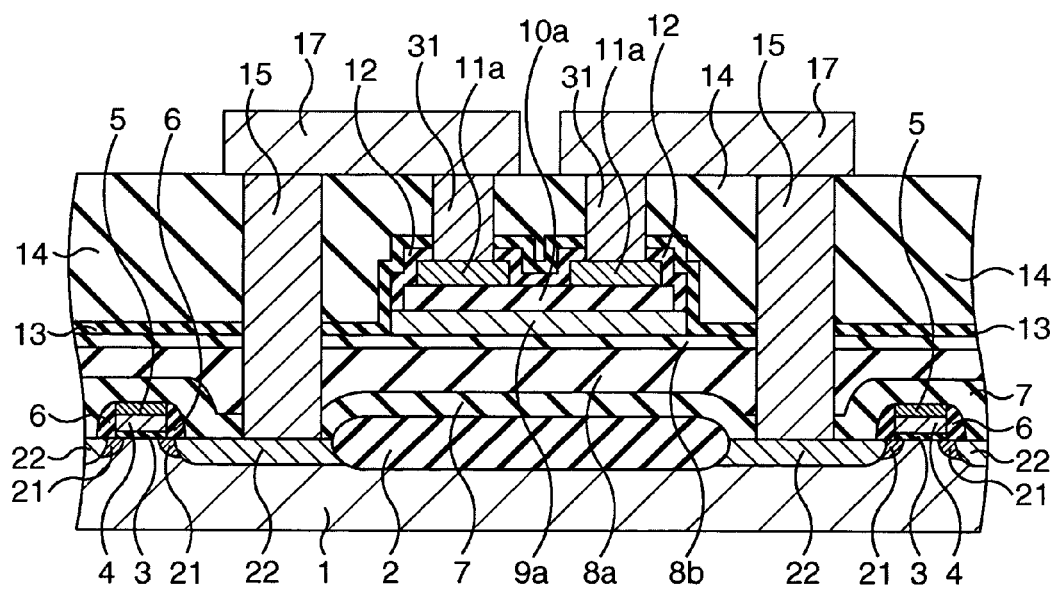
FIG. 8 is a sectional view showing a plug 31.

Besides, in the above-stated embodiment, the Al wiring 17 is embedded in the contact hole 19, but for example, a plug 31 composed of W, Al—Cu alloy, or the like may be embedded in the contact hole 19, and the Al wiring 17 may be formed so as to connect the W plug 15 and the plug 31 as shown in FIG. 8. However, when W is embedded inside of the contact hole 20 reaching the bottom electrode 9a containing Pt, it is preferable to form a barrier metal film such as a TiN film before W is embedded to thereby suppress a reaction between the plug 31 and the bottom electrode 9a.

Figure 9:
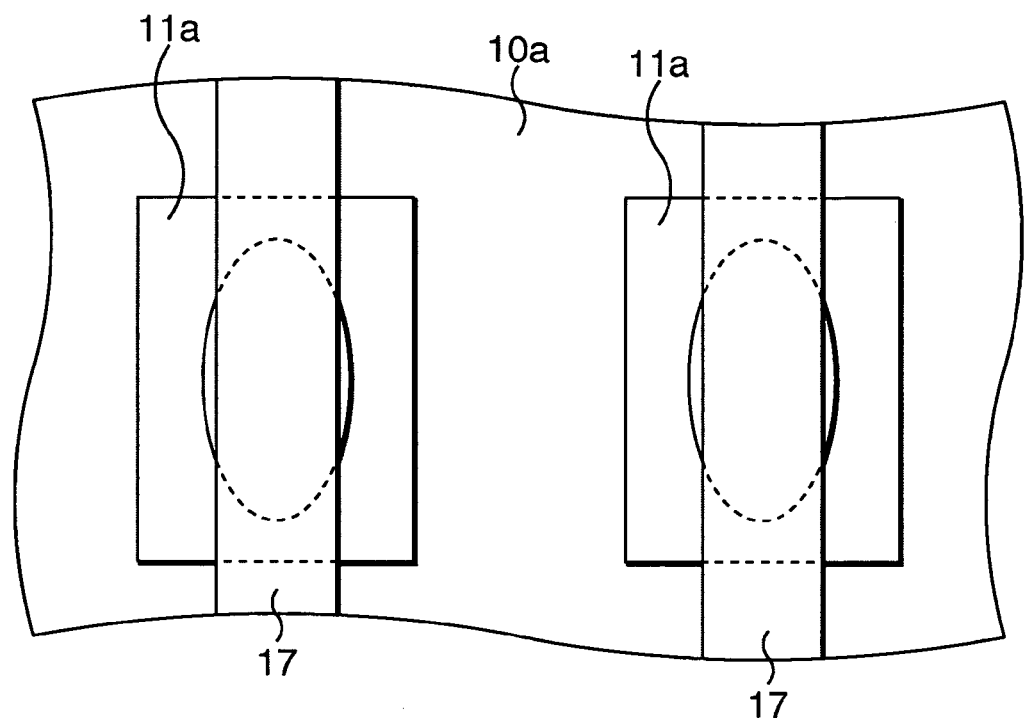
FIG. 9 is a schematic view showing another example of a planar shape of the wiring 17.
Figure 10:
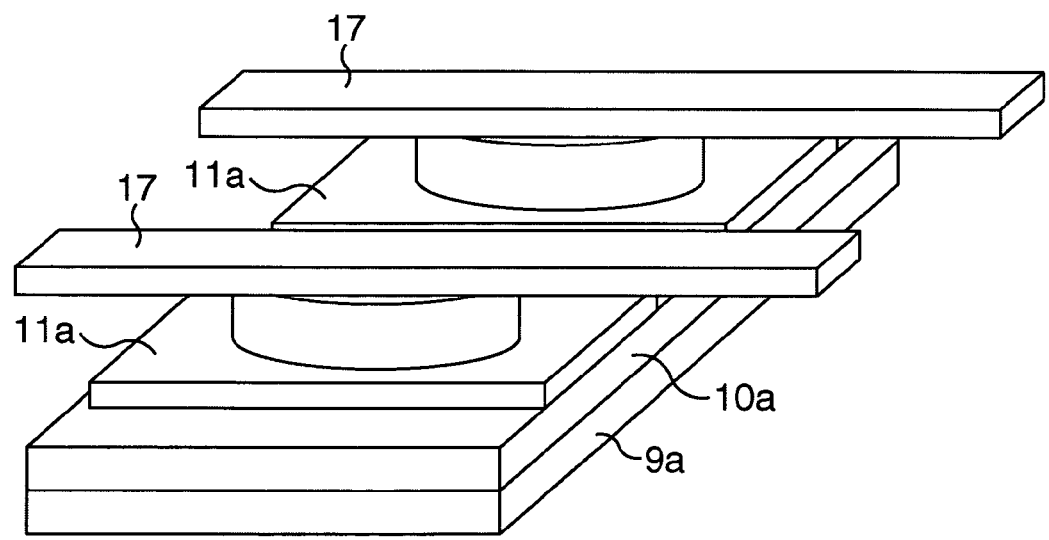
FIG. 10 is a schematic view showing still another example of a shape of the wiring 17.

Besides, the direction in which the wiring 17 is extending is not particularly limited, and for example, it may be set to extend in a direction parallel to the major axis of the contact hole as shown in FIG. 9 and FIG. 10.

INDUSTRIAL APPLICABILITY

As stated above, according to the present invention, a contact area of a wiring and a top electrode can be secured largely, and therefore, it is possible to suppress peeling of the top electrode from a ferroelectric film by reducing stress operating on a contact surface between the top electrode and the ferroelectric film.

What is claimed is:
1. A semiconductor device, comprising:
a semiconductor substrate;
a ferroelectric capacitor formed above said semiconductor substrate;
an interlayer insulating film covering said ferroelectric capacitor, in which a hole reaching a top electrode of said ferroelectric capacitor is formed; and
a wiring formed on said interlayer insulating film and connected to the top electrode via the hole,
wherein a planar shape of the hole is a shape in which lengths of two axes orthogonal to each other are different; and
wherein a direction in which a major axis of the hole is extending corresponds to a direction in which a long side of the top electrode is extending.

2. The semiconductor device according to claim 1, wherein the planar shape of the hole is an ellipse.

3. The semiconductor device according to claim 1, wherein the planar shape of the hole is a rectangle.

4. The semiconductor device according to claim 1, wherein the planar shape of the hole is a shape in which four corners of a rectangle are rounded off.

5. The semiconductor device according to claim 1, wherein said ferroelectric capacitor includes:
   a ferroelectric film containing Pb, Zr and Ti; and
   a top electrode formed on the ferroelectric film and containing Ir.

\* \* \* \* \*